United States Patent
Kim et al.

(10) Patent No.: US 8,963,332 B2
(45) Date of Patent: Feb. 24, 2015

(54) SEMICONDUCTOR DEVICE WITH DUMMY LINES

(71) Applicant: Samsung Electronics Co., Ltd., Suwon-si, Gyeonggi-do (KR)

(72) Inventors: Tae-Soo Kim, Seoul (KR); Byung-Hee Kim, Seoul (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 27 days.

(21) Appl. No.: 13/840,694

(22) Filed: Mar. 15, 2013

(65) Prior Publication Data

US 2014/0264892 A1   Sep. 18, 2014

(51) Int. Cl.
| | |
|---|---|
| H01L 23/48 | (2006.01) |
| H01L 23/522 | (2006.01) |
| H01L 27/02 | (2006.01) |
| H01L 23/528 | (2006.01) |
| H01L 23/58 | (2006.01) |

(52) U.S. Cl.
CPC .......... H01L 23/522 (2013.01); H01L 27/0207 (2013.01); H01L 23/528 (2013.01); H01L 23/585 (2013.01)
USPC ..................................... 257/773; 257/E23.01

(58) Field of Classification Search
CPC . H01L 23/552; H01L 23/528; H01L 27/0207; H01L 23/585
USPC ............................................ 257/733, E23.01
See application file for complete search history.

(56) References Cited

U.S. PATENT DOCUMENTS

| 5,379,233 A | 1/1995 | Tripathi et al. |
|---|---|---|
| 7,663,207 B2 | 2/2010 | Kikuta et al. |
| 7,902,583 B2 | 3/2011 | Liu |
| 8,115,276 B2 | 2/2012 | Zhang et al. |
| 2008/0290454 A1 | 11/2008 | Fujii |
| 2011/0272782 A1 | 11/2011 | Yang |
| 2011/0287595 A1 | 11/2011 | Koubuchi et al. |

FOREIGN PATENT DOCUMENTS

| JP | 2004-146632 | 5/2004 |
|---|---|---|
| JP | 2005-150145 | 6/2005 |
| JP | 2006-032742 | 2/2006 |
| JP | 2006-253498 | 9/2006 |
| JP | 2010-011856 | 1/2010 |
| JP | 2010-177688 | 8/2010 |

*Primary Examiner* — Long Pham
(74) *Attorney, Agent, or Firm* — F. Chau & Associates, LLC

(57) ABSTRACT

A semiconductor device includes a first main strap, a second main strap, a plurality of first sub straps, a plurality of second sub straps, and a plurality of dummy lines. The first main strap is extended in a first direction. The second main strap is extended in the first direction. A plurality of first sub straps is branched from the first main strap. The plurality of second sub straps is branched from the second main strap. The plurality of dummy lines is positioned between the first main strap and the second main strap. Each of the plurality of dummy lines is positioned between each of the plurality of first sub straps and each of the plurality of second sub straps. Each of the dummy lines is spaced apart from the first main strap, the second main strap, each of the first sub straps and each of the second sub straps.

20 Claims, 14 Drawing Sheets

SEMICONDUCTOR DEVICE WITH DUMMY LINES

TECHNICAL FIELD

The present inventive concept relates to a semiconductor device with dummy lines.

DESCRIPTION OF RELATED ART

As semiconductor devices become highly integrated, patterns of the semiconductor devices are closely formed to each other. Accordingly, signal interference between the patterns may affect device operation.

SUMMARY

The present inventive concept provides floating dummy lines to a vertical natural capacitor (VNCAP) of a semiconductor device.

According to an exemplary embodiment of the inventive concept, a semiconductor device includes a first main strap, a second main strap, a plurality of first sub straps, a plurality of second sub straps, and a plurality of dummy lines. The first main strap is extended in a first direction. The second main strap is extended in the first direction. A plurality of first sub straps is branched from the first main strap. The plurality of second sub straps is branched from the second main strap. The plurality of dummy lines is positioned between the first main strap and the second main strap. Each of the plurality of dummy lines is positioned between each of the plurality of first sub straps and each of the plurality of second sub straps. Each of the dummy lines is spaced apart from the first main strap, the second main strap, each of the first sub straps and each of the second sub straps.

According to a semiconductor device includes a first main strap, a second main strap, a first sub strap, a second sub strap, and a dummy line. The first main strap is extended in a first direction. The second main strap is extended in the first direction. The first sub strap is branched from the first main strap in a second direction perpendicular to the first direction. The second sub strap is branched from the second main strap in a third direction perpendicular to the first direction and opposite to the second direction. The dummy line is positioned between the first sub strap and the second sub strap. The dummy line is spaced apart from the first main strap, the second main strap, the first sub strap and the second sub strap. A distance between the first sub strap and the dummy line is substantially equal to a distance between the second sub strap and the dummy line.

According to a semiconductor device includes a first main strap, a second main strap, a first sub strap, a second sub strap, and a dummy line. The first main strap is extended in a first direction. The second main strap is extended in the first direction. The first sub strap is branched from the first main strap in a second direction perpendicular to the first direction. The second sub strap is branched from the second main strap in a third direction perpendicular to the first direction and opposite to the second direction. A dummy line is positioned at a center between the first sub strap and the second sub strap. The dummy line has a first width, and the first sub strap and the second sub strap have a second width substantially the same as the first width.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF THE EMBODIMENTS

Figure 1:
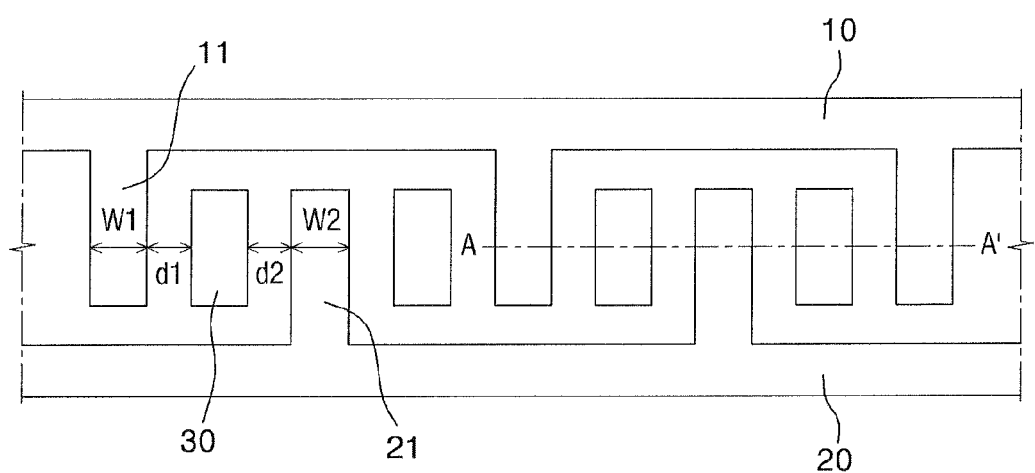
FIG. 1 shows a plan view of a semiconductor device according to an exemplary embodiment of the present inventive concept.

Exemplary embodiments of the inventive concept will be described below in more detail with reference to the accompanying drawings. However, the inventive concept may be embodied in different forms and should not be construed as limited to the embodiments set forth herein. In the drawings, the thickness of layers and regions may be exaggerated for clarity. Like reference numerals may refer to the like elements throughout the specification and drawings.

FIG. 1 shows a plan view of a semiconductor device according to an exemplary embodiment of the present inventive concept.

Referring to FIG. 1, the semiconductor device includes a first main strap 10, a second main strap 20, first sub straps 11, second sub straps 21, and dummy lines 30.

The first main strap 10 is extended in a first direction. The second main strap 20 is formed in the first direction. The first main strap 10 and the second main strap 20 may include conductive materials.

The first sub straps 11 are branched from the first main strap 10. The second sub straps 21 are branched from the second main strap 20. The first sub straps 11 and the second sub straps 21 are branched in a direction perpendicular to the first direction. The first sub straps 11 and the second sub straps 21 are extended in opposite directions. The first sub straps 11 have a width W1, and the second sub straps 21 have a width W2. The width W1 may be substantially the same as the width W2. For example, W1 and W2 may be about 24 nm. The first sub straps 11 and the second sub straps 21 may include conductive materials.

The dummy lines 30 are positioned between the first sub straps 11 and the second sub straps 21. The dummy lines 30 may be formed in a self-aligned manner. For example, the dummy lines 30 are spaced apart from the first main strap 10, the second main strap 20, the first sub straps 11 and the second sub straps 21. A first gap distance d1 is a distance between each of the first sub straps 11 and each of the dummy lines 30. A second gap d2 is a distance between each of second sub straps 21 and each of the dummy lines 30. The first gap distance d1 is substantially the same as the second gap distance d2. For example, the first gap distance d1 and the second gap distance d2 may be about 24 nm. When a SADP (Self Aligned Double Patterning) process with a space CD of 24 nm is employed, the first gap distance d1 and the second gap distance d2 may be about 23 nm. The dummy lines 30 may include conductive materials. Alternatively, the first gap distance d1 may differ from the second gap distance d2.

Figure 2:
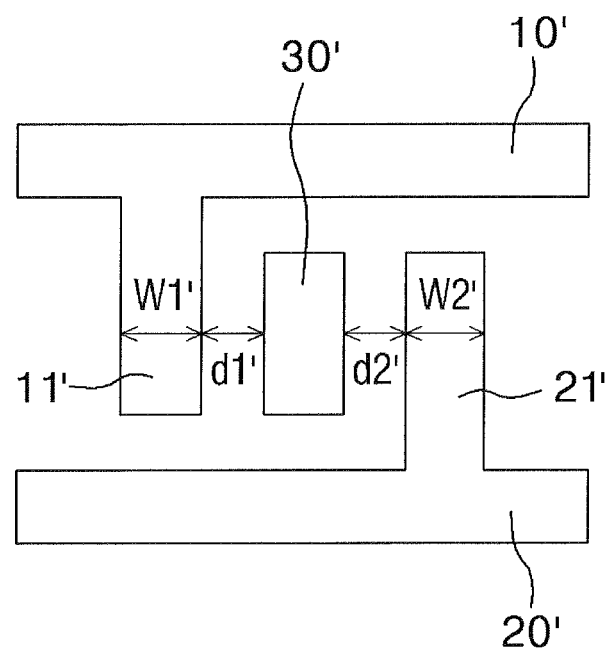
FIG. 2 shows a plan view of a semiconductor device according to an exemplary embodiment of the present inventive concept.

FIG. 2 shows a plan view of a semiconductor device according to an exemplary embodiment of the present inventive concept. For the convenience of explanation, substantially the same portions as those of the embodiment described above will be omitted here.

Referring to FIG. 2, a semiconductor device according to an exemplary embodiment of the present inventive concept includes a first main strap 10', a second main strap 20', a first sub strap 11', a second sub strap 21', and a dummy line 30'.

The first main strap 10' is extended in a first direction. The second main strap 20' is formed in the first direction. The first main strap 10' and the second main strap 20' may include conductive materials.

The first sub strap 11' is branched from the first main strap 10'. The second sub strap 21' is branched from the second main strap 20'. The first sub straps 11' and the second sub straps 21' are branched in a direction perpendicular to the first direction. The first sub straps 11' and the second sub straps 21' are extended in opposite directions. The first sub straps 11' have a width W1' and the second sub straps 21' have a width W2'. The width W1' is substantially the same with the width W2'. For example, the width W1' and the width W2' may be about 22 nm. The first sub straps 11' and the second sub straps 21' may include conductive materials.

The dummy line 30' is positioned between the first sub strap 11' and the second sub strap 21'. The dummy line 30' may be formed in a self-aligned manner. For example, each of the dummy line 30' is spaced apart from the first main strap 10', the second main strap 20', each of the first sub straps 11' and each of the second sub straps 21'. A first gap d1' is a distance between each of the first sub straps 11' and the dummy line 30'. A second gap d2' is a distance between each of second sub straps 21' and the dummy line 30'. The first gap d1' is substantially the same as the second gap d2'. For example, the first gap d1' and the second gap d2' may be about 24 nm. When a SADP process with a space CD of 24 nm is employed, the first gap d1' and the second gap d2' may be about 24 nm. The dummy line 30' may include conductive materials. Alternatively, the first gap distance d1 may differ from the second gap distance d2.

FIGS. 3 to 12 are cross-sectional views taken along line A-A' of FIG. 1 of a structure at intermediate process steps in a method for fabricating a semiconductor device according to an exemplary embodiment of the present inventive concept.

Figure 3:
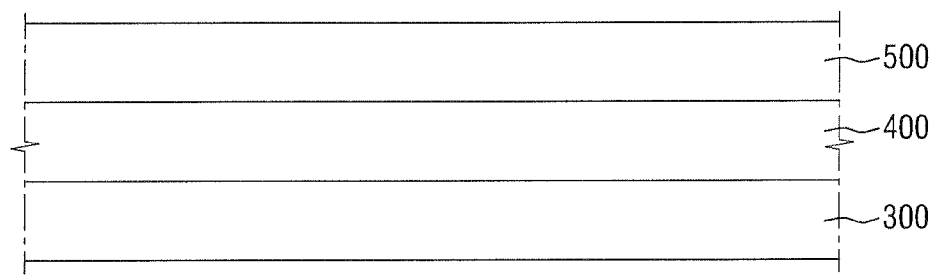
FIGS. 3 to 12 show cross-sectional views taken along line A-A' of FIG. 1 at intermediate process steps in a method for fabricating a semiconductor device according to an exemplary embodiment of the present inventive concept.

Referring to FIG. 3, an etching target layer 400 and a mask layer 500 are sequentially formed on a substrate 300.

The substrate 300 may include Si, Ge, SiGe, GaP, GaAs, SiC, SiGeC, InAs, and/or InP. Alternatively, the substrate 300 may include a silicon on insulator (SOI) substrate or a germanium on insulator (GOI) substrate. Alternatively, the substrate 300 may include, for example, a rigid substrate such as a glass substrate for a display, and a flexible plastic substrate made of polyimide, polyester, polycarbonate, polyethersulfone, polymethylmethacrylate, polyethylene naphthalate, and polyethyleneterephthalate.

Various structures (not shown) may further be formed on the substrate 300. For example, a conductive structure or an insulating layer (not shown), such as a conductive layer (not shown) or an electrode (not shown) including, for example, a metal, metal nitride, metal silicide, etc., may further be formed on the substrate 300. The etching target layer 400 may further be formed on the substrate 300. In a case where an etching target is the substrate 300, the etching target layer 400 is not formed.

The etching target layer 400 may be formed by performing a chemical vapor deposition (CVD) process, a plasma enhanced chemical vapor deposition (PECVD) process, a spin coating process, or a high density plasma-chemical vapor deposition (HDP-CVD) process, using, for example, silicon oxides, such as phosphosilicate glass (PSG), borophosphosilicate glass (BPSG), undoped silicate glass (USG), tetraethlyorthosilicate glass (TEOS), plasma enhanced-TEOS (PE-TEOS), a HDP-CVD oxide, or a porous oxide or silicon nitride, such as low-k (LK) dielectric material or ultra low-k (ULK) dielectric material, used in a back-end of line (BEOL) process.

The mask layer 500 is formed on the etching target layer 400. When the etching target layer 400 is not formed on the substrate 300, the mask layer 500 may be formed on the substrate 300. The mask layer 500 may include a material having etching selectivity with respect to the etching target layer 400 or the substrate 300. For example, the mask layer 500 includes a material that is rarely etched while the etching target layer 400 or the substrate 300 is being etched. The mask layer 500 may be formed by depositing silicon oxide through a PE-CVD process. The mask layer 500 may be formed using a silicon based spin-on hard mask (Si—SOH), such as spin-on glass (SOG). An anti-reflection layer (not shown) may further be formed on the mask layer 500. The anti-reflection layer may include silicon oxynitride (SiON) formed by a CVD process.

Figure 4:
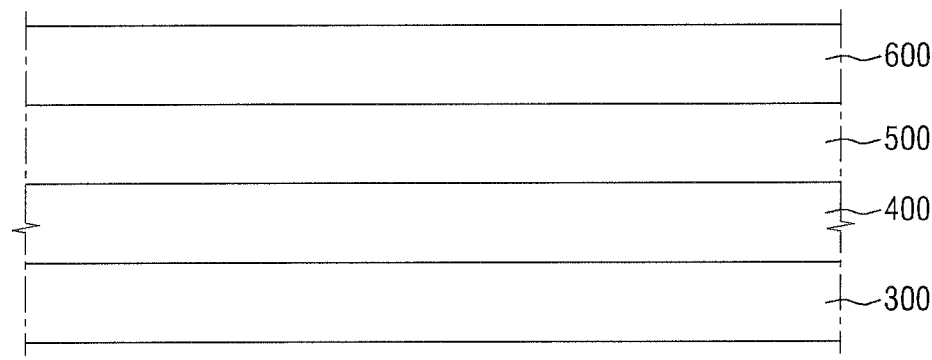
Figure 5:
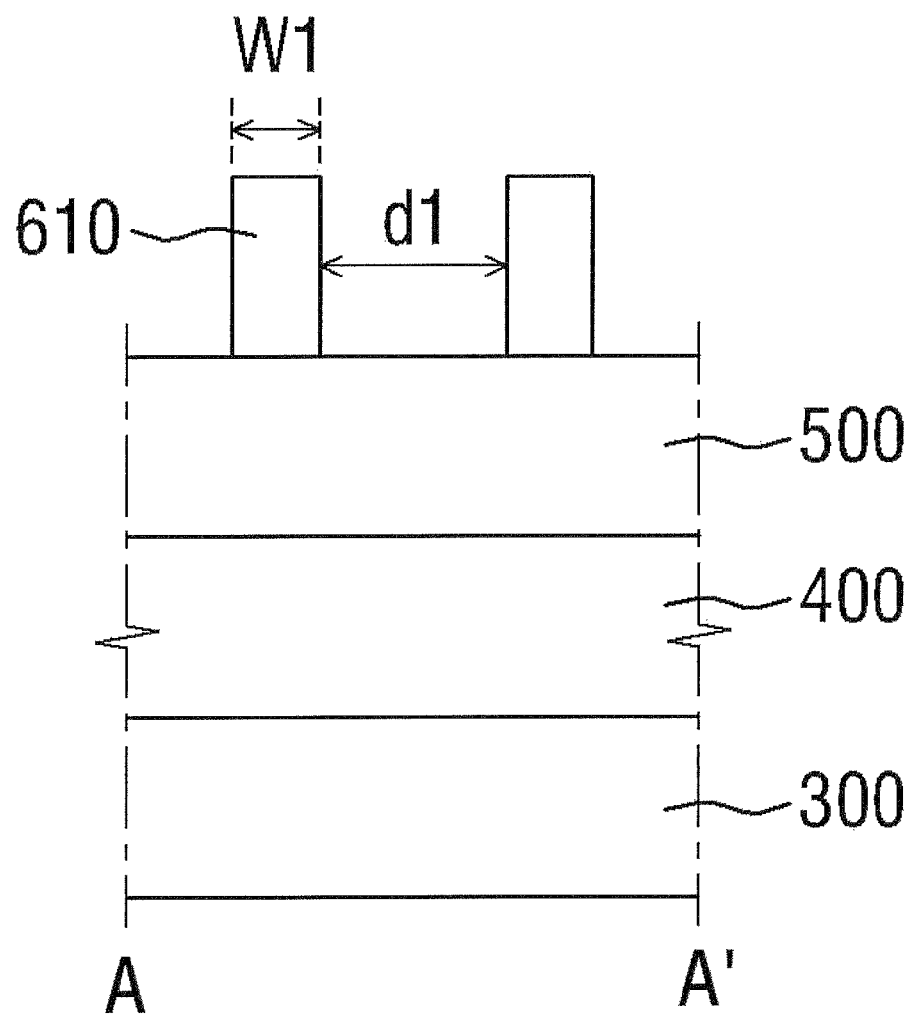

Referring to FIGS. 4 and 5, a pattern layer 600 is formed on the mask layer 500. The pattern layer 600 is etched to form patterns 610. The patterns 610 may be formed by a photolithography process. The pattern layer 600 may include a carbon-spin on hardmask material containing approximately 99% carbon. For example, the carbon-spin on hardmask material may be spin-coated on the mask layer 500 and baked at a temperature of 350° C. to 450° C. for curing, thereby forming the patterns 610. An anti-reflection layer (not shown) may be formed on the patterns 610. However, for the purpose of simplifying the process, the forming of the anti-reflection layer may be omitted. The anti-reflection layer may serve to minimize reflection between a photoresist layer and a substrate in a subsequent process. In a case where the anti-reflection layer is formed, silicon oxynitride may be deposited by a CVD process.

Figure 6:
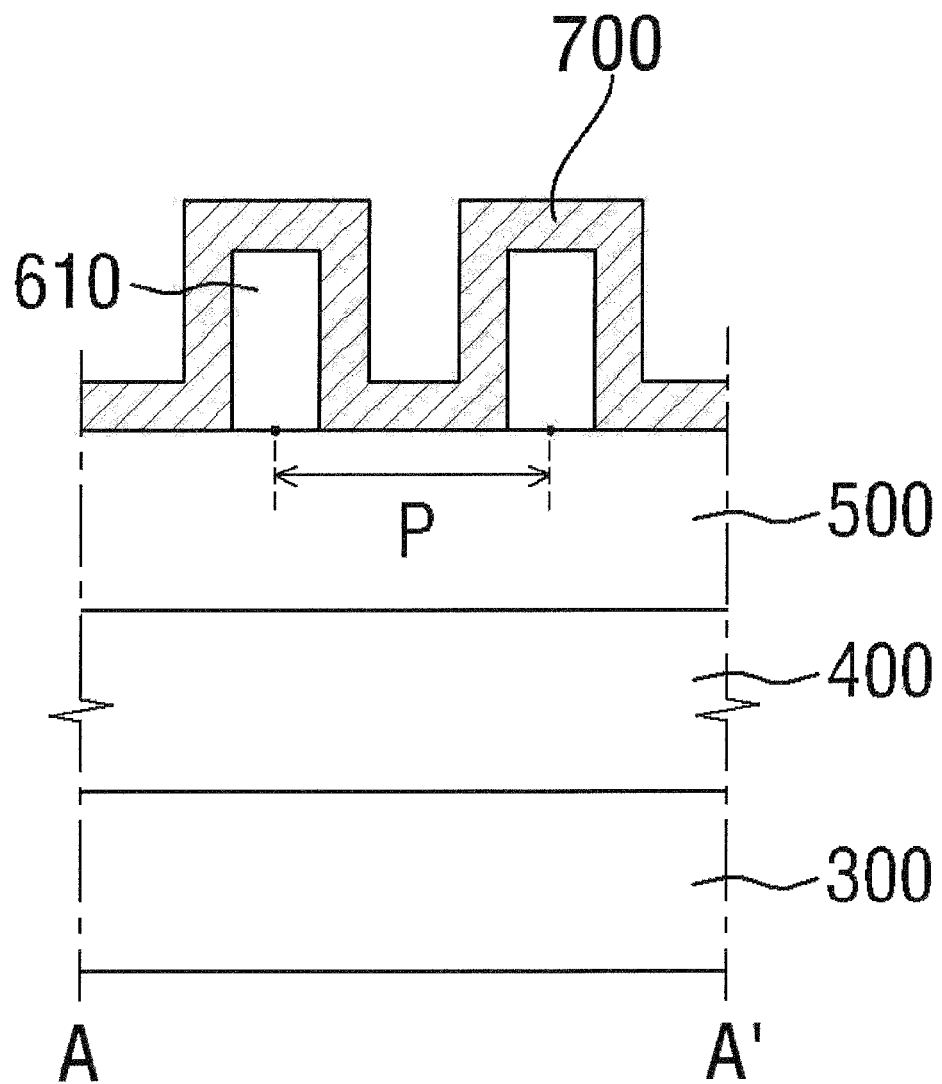

Referring to FIG. 6, a spacer layer 700 is formed on the patterns 610. For example, the spacer layer 700 may be conformally formed on the patterns 610. Hereinafter, it is assumed that a pitch P (i.e., center-to-center distance between identical patterns) between patterns is 96 nm and a space CD (Critical Dimension) is about 24 nm. According to an embodiment, the spacer layer 700 may have a thickness of the space CD. A width W1 of each of the plurality of patterns 610 may be about 22 nm. In this case, an empty space between the spacer layer 700 formed on side walls of the patterns 610 has a width of 24 nm.

The spacer layer 700 may include a material having etching selectivity with respect to the patterns 610. For example, the spacer layer 700 may include a silicon oxide, such as a low temperature oxide (LTO), a middle temperature oxide (MTO), a high temperature oxide (HTO) or an ALD oxide, and/or a silicon nitride (SiN).

Figure 7:
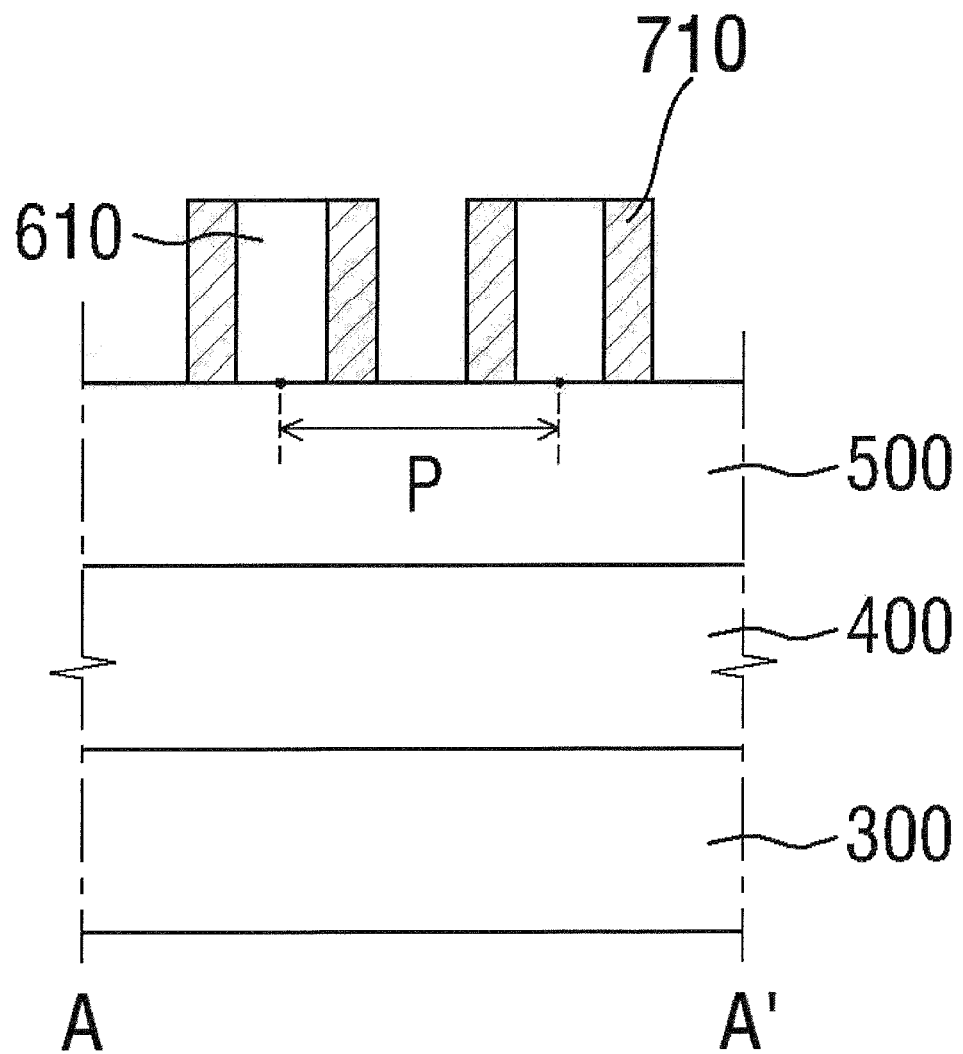

Referring to FIG. 7, the spacer layer 700 is partially removed to form spacer patterns 710 formed on both side walls of the patterns 610 using an etch-back process. For example, the etch-back process removes the spacer layer 700 formed on top surfaces of the plurality of patterns 610 and a portion of a top surface of the mask layer 500, while the spacer layer 700 formed on sidewalls of the plurality of patterns 610 remains.

Figure 8:
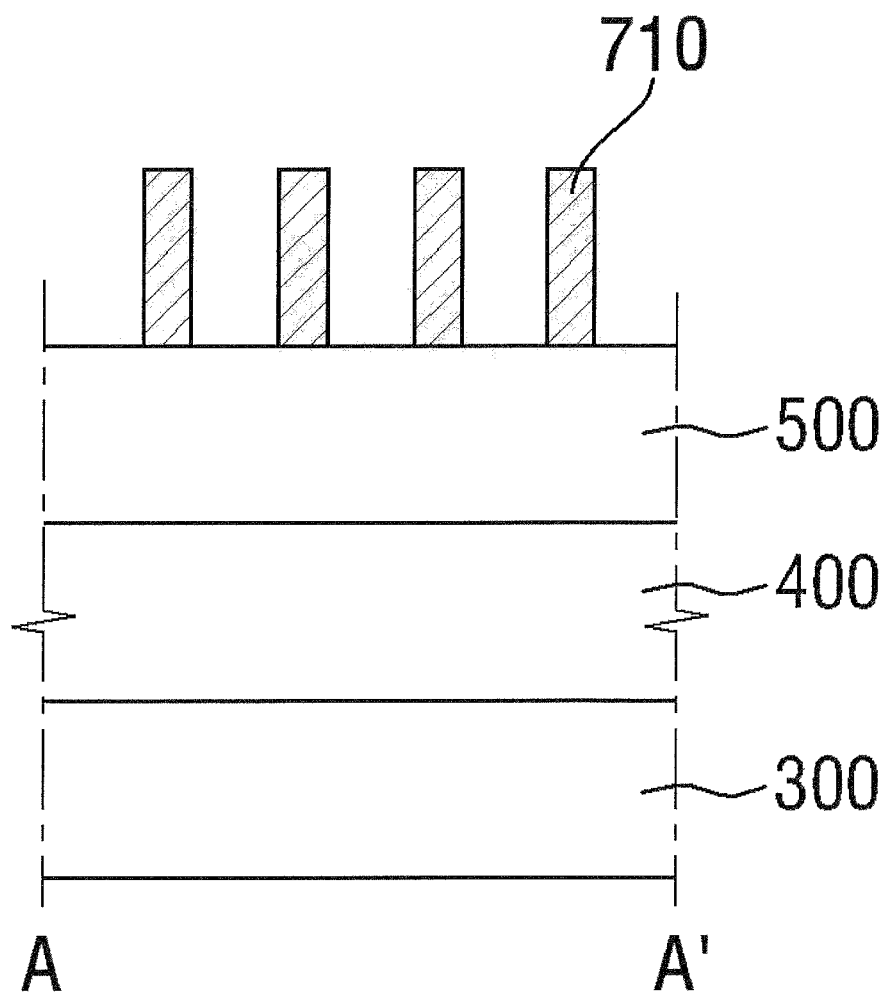

Referring to FIG. 8, the patterns 610 are removed. The spacer patterns 710 may include a material having etching selectivity with respect to the patterns 610. In removing patterns 610, the plurality of patterns 610 may be selectively removed using an etchant that is capable of etching the patterns 610, but rarely etches the spacer patterns 710.

Figure 9:
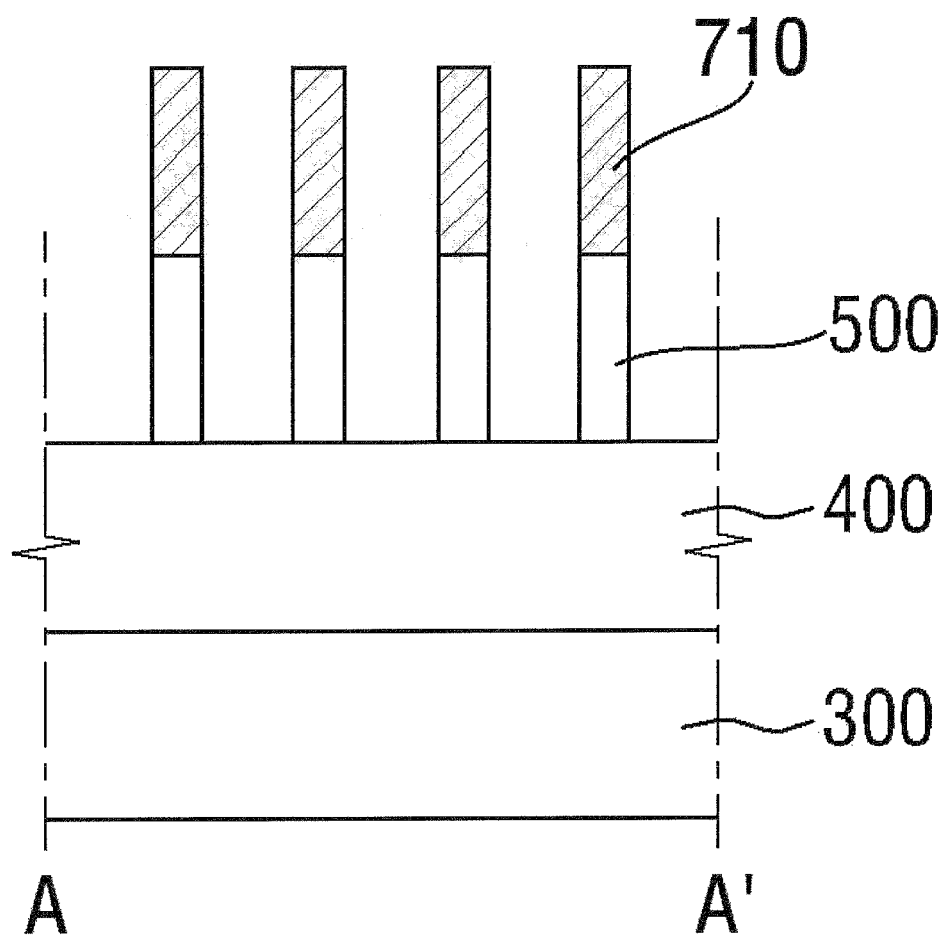
Figure 10:
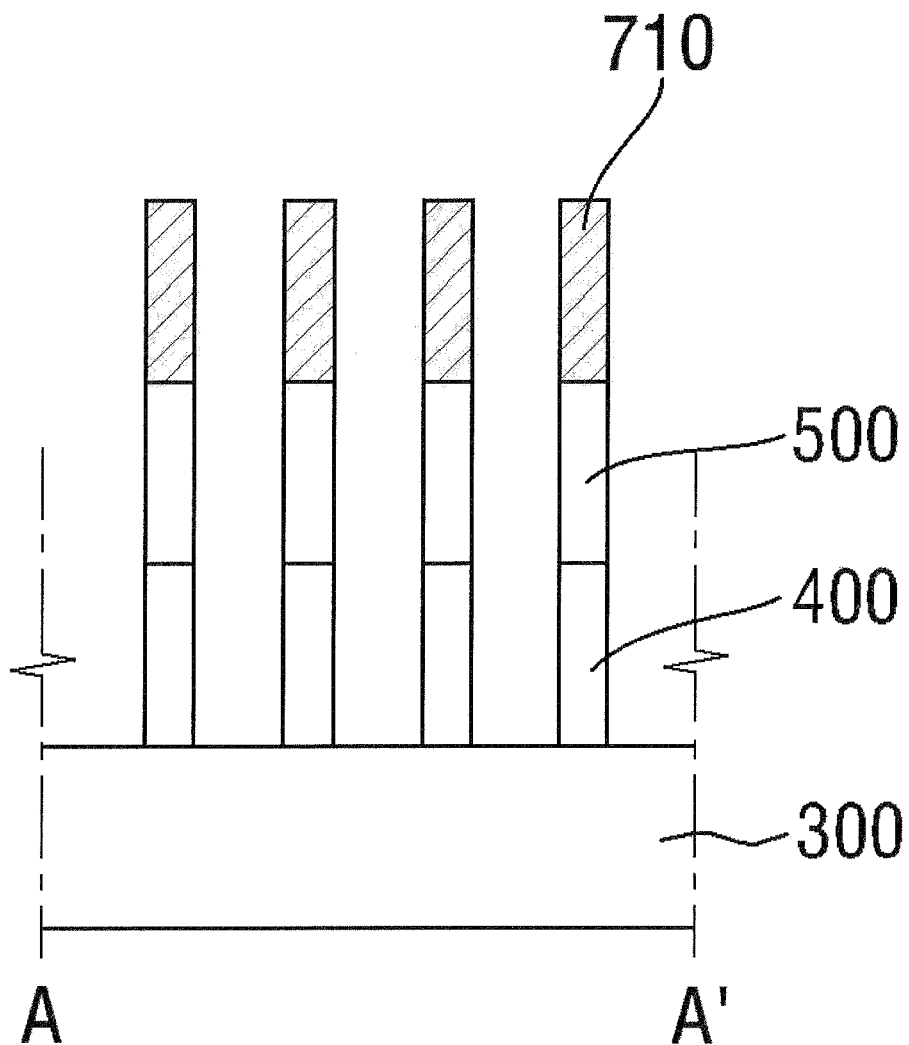

Referring to FIGS. 9 and 10, the mask layer 500 and the etching target layer 400 are sequentially removed to form trenches 900. For example, the mask layer 500 and the etching target layer 400 may be sequentially etched using the spacer patterns 710 as an etch mask. The trenches 900 expose corresponding upper surfaces of the substrate 300.

Figure 11:
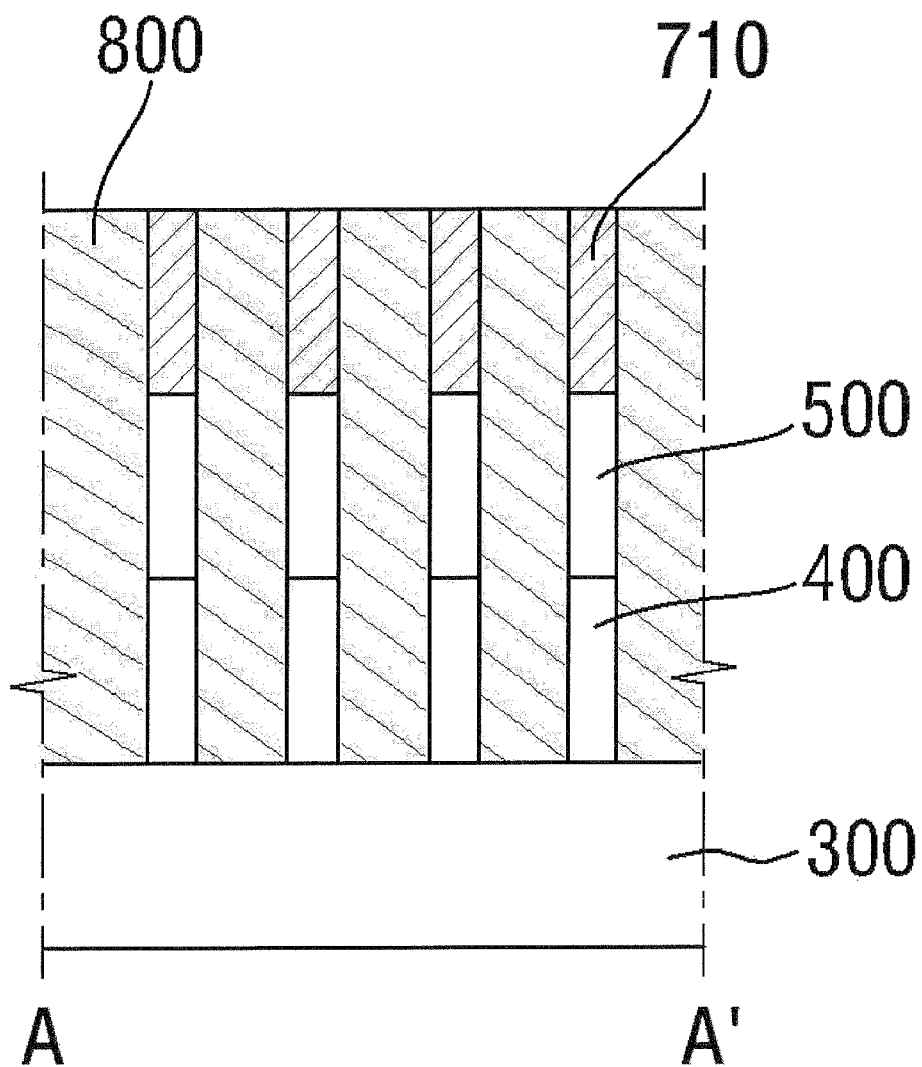

Referring to FIG. 11, a metal material 800 is filled in the trenches 900. The metal material 800 may include, for example, copper (Cu).

Figure 12:
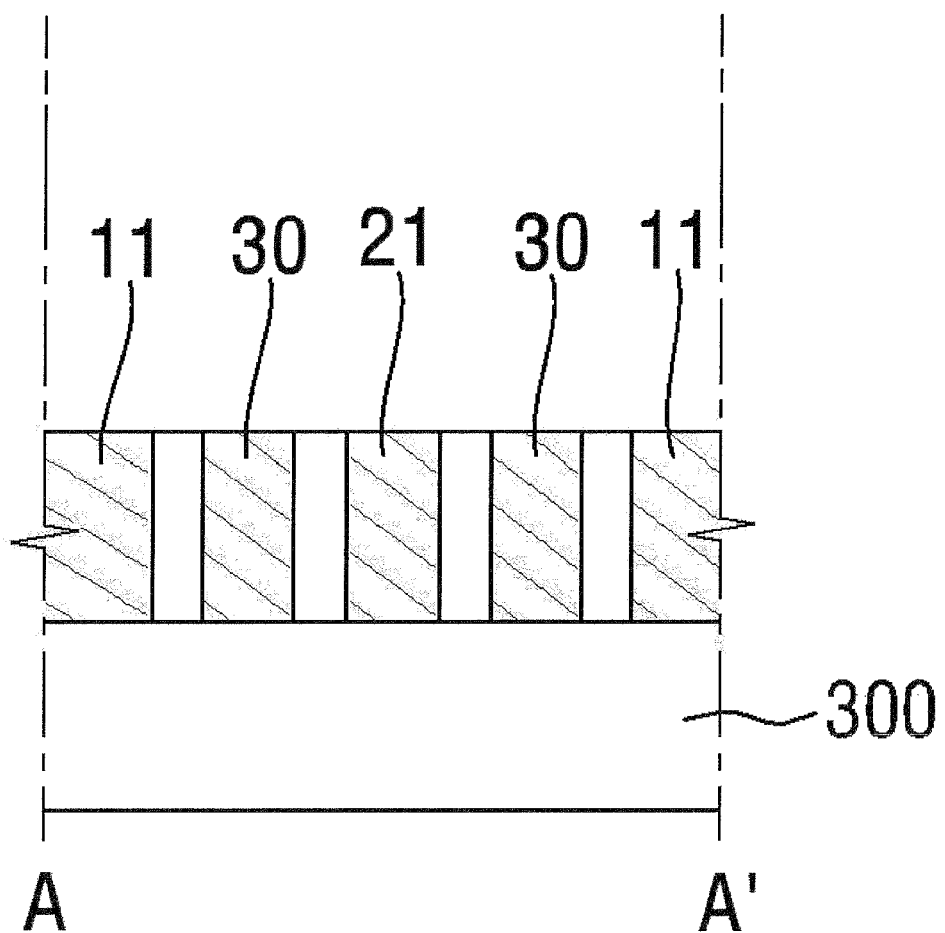

Referring to FIG. 12, a top portion of the etching target layer 400 is removed to form metal patterns including the first sub straps 11, the second sub straps 21, and dummy lines 30 using a planarization process (e.g., CMP). The dummy lines 30 are positioned between the first sub straps 11 and the second sub straps 21 using the SADP process.

Figure 13:
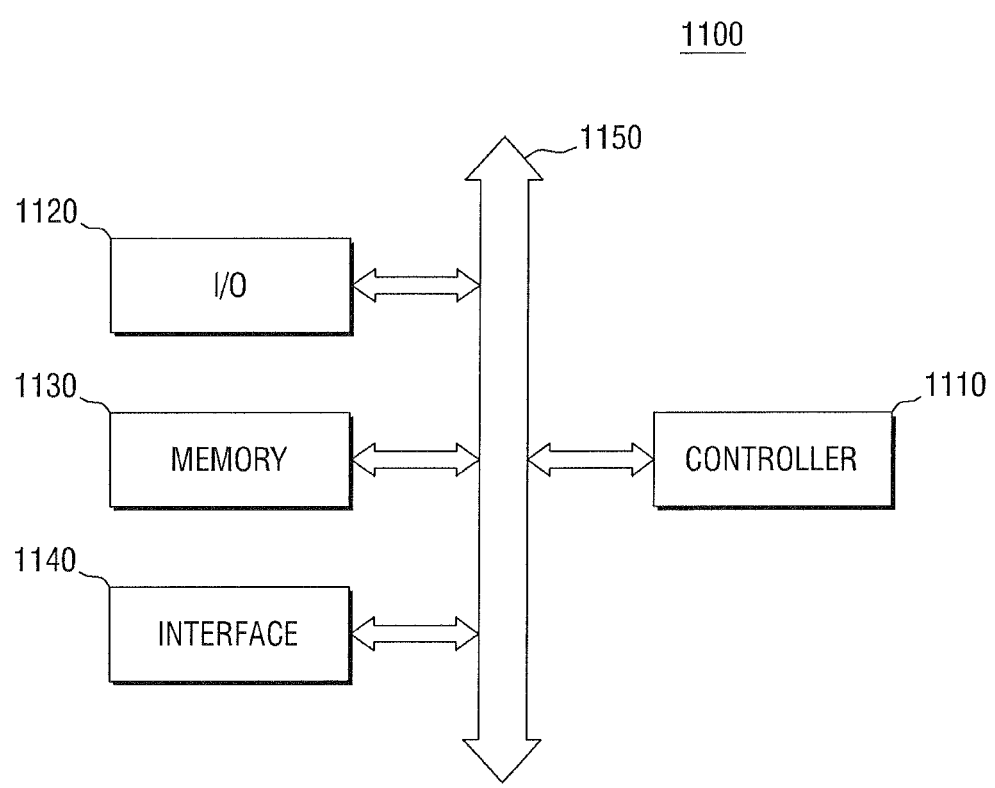
FIG. 13 shows a block diagram of an electronic system including a semiconductor device manufactured according to some embodiments of the present inventive concept.

FIG. 13 shows a block diagram of an electronic system including a semiconductor device manufactured according to some embodiments of the present inventive concept.

Referring to FIG. 13, the electronic system 1100 may include a controller 1110, an input/output device (I/O) 1120, a memory 1130, an interface 1140, and a bus 1150. The controller 1110, the I/O 1120, the memory 1130 and/or the interface 1140 may be connected to each other through the bus 1150. The bus 1150 corresponds to a path along which data moves.

The controller 1110 may include a microprocessor, a digital signal processor, a microcontroller, and/or logic devices. The logic devices may be capable of performing functions similar to those of a microprocessor, a digital signal processor, or a microcontroller. The I/O 1120 may include a keypad, a keyboard, a display, and so on. The memory 430 may store data and/or commands. The interface 1140 may transmit data to a communication network or receive data from the communication network. The interface 1140 may be wired or wireless. For example, the interface 1140 may include an antenna or a wired/wireless transceiver. The electronic system 1100 may include an operating memory (not shown) for improving the operation of the controller 410. The operating memory (not shown) may include a high-speed DRAM and/or SRAM.

The electronic system 1100 may include a personal digital assistant (PDA), a portable computer, a web tablet, a wireless phone, a mobile phone, a digital music player, a memory card, or any type of electronic device capable of transmitting and/or receiving information in a wireless environment.

Figure 14:
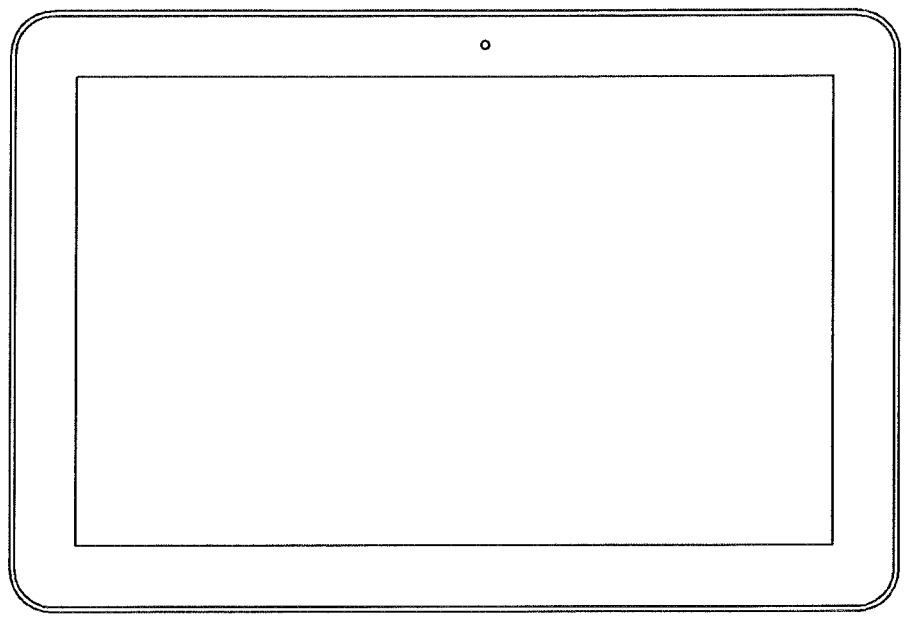
FIGS. 14 and 15 show exemplary semiconductor systems including a semiconductor device manufactured according to some embodiments of the present inventive concept can be applied.
Figure 15:
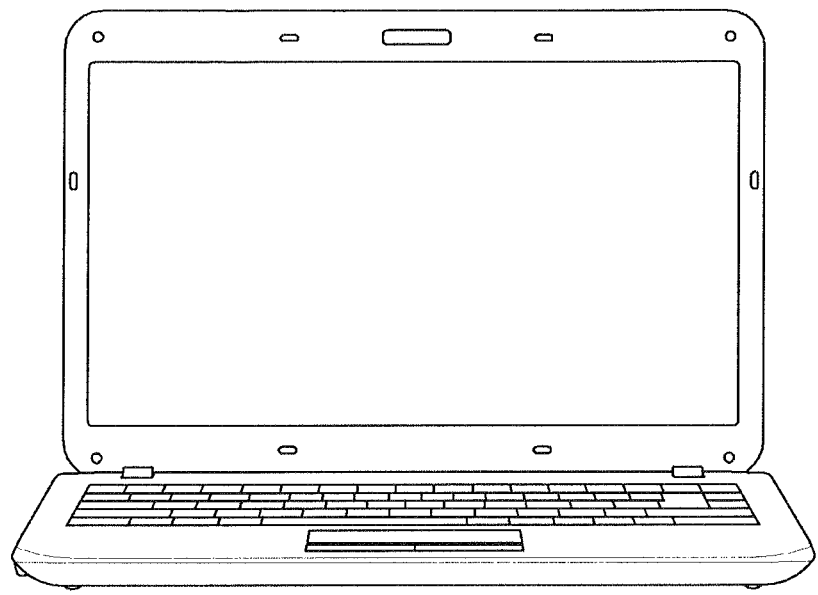

FIGS. 14 and 15 show exemplary semiconductor systems including a semiconductor device according to some embodiments of the present inventive concept.

For example, FIG. 14 shows a tablet PC and FIG. 15 shows a notebook computer. At least one semiconductor devices according to some embodiments of the present inventive concept may be included in the tablet PC, a notebook computer, or the like.

While the present inventive concept has been shown and described with reference to exemplary embodiments thereof, it will be apparent to those of ordinary skill in the art that various changes in form and detail may be made therein without departing from the sprit and scope of the inventive concept as defined by the following claims.

What is claimed is:

1. A semiconductor device comprising:
  a first main strap extended in a first direction;
  a second main strap extended in the first direction;
  a plurality of first sub straps branched from the first main strap;
  a plurality of second sub straps branched from the second main strap; and
  a plurality of dummy lines positioned between the first main strap and the second main strap,
  wherein each of the plurality of dummy lines is positioned between each of the plurality of first sub straps and each of the plurality of second sub straps, and wherein each of the dummy lines is spaced apart from the first main strap, the second main strap, each of the first sub straps and each of the second sub straps.

2. The semiconductor device of claim 1, wherein the plurality of first sub straps is branched in a second direction perpendicular to the first direction, and the plurality of second sub straps is branched in a third direction perpendicular to the first direction and opposite to the second direction.

3. The semiconductor device of claim 1, wherein each of the first sub straps is spaced apart from each of the dummy lines at a first gap, and each of the second sub straps is spaced apart from each of the dummy lines at a second gap.

4. The semiconductor device of claim 3, wherein the first gap and the second gap are substantially equal to each other.

5. The semiconductor device of claim 4, wherein the plurality of dummy lines has a width substantially the same as that of the first gap.

6. The semiconductor device of claim 4, wherein the first gap and the second gap have a distance of 24 nm.

7. The semiconductor device of claim 1, wherein the first sub straps and the second sub straps have substantially the same width.

8. The semiconductor device of claim 7, wherein the first sub straps and the second sub straps have a width of 24 nm.

9. The semiconductor device of claim 1, wherein the first main strap, the second main strap, the plurality of first sub straps, the plurality of second sub straps and the plurality of dummy lines include conductive material.

10. The semiconductor device of claim 1, wherein the dummy lines are formed in a self-aligned manner.

11. A semiconductor device comprising:
  a first main strap extended in a first direction;
  a second main strap extended in the first direction;
  a first sub strap branched from the first main strap in a second direction perpendicular to the first direction;
  a second sub strap branched from the second main strap in a third direction perpendicular to the first direction and opposite to the second direction; and
  a dummy line positioned between the first sub strap and the second sub strap,
  wherein the dummy line is spaced apart from the first main strap, the second main strap, the first sub strap and the second sub strap, and wherein a distance between the first sub strap and the dummy line is substantially equal to a distance between the second sub strap and the dummy line.

12. The semiconductor device of claim 11, wherein the distance between the first sub strap and the dummy line is about 24 nm.

13. The semiconductor device of claim 11, wherein the first sub strap and the second sub strap have substantially the same width.

14. The semiconductor device of claim 11, wherein the first main strap, the second main strap, the first sub strap, the second sub strap and the dummy line include conductive material.

15. The semiconductor device of claim 11, wherein the dummy line is formed in a self-aligned manner.

16. A semiconductor device comprising:
a first main strap extended in a first direction;
a second main strap extended in the first direction;
a first sub strap branched from the first main strap in a second direction perpendicular to the first direction;
a second sub strap branched from the second main strap in a third direction perpendicular to the first direction and opposite to the second direction; and
a dummy line positioned at a center between the first sub strap and the second sub strap,
wherein the dummy line has a first width, and wherein the first sub strap and the second sub strap have a second width substantially the same as the first width.

17. The semiconductor device of claim 16, wherein the dummy line is spaced apart from the first main strap at a first gap, and the dummy line is spaced apart from the second sub strap at a second gap substantially the same as the first gap.

18. The semiconductor device of claim 17, wherein the first width of the dummy line is substantially the same as the first gap.

19. The semiconductor device of claim 16, wherein the first main strap, the second main strap, the first sub strap, the second sub strap and the dummy line include conductive material.

20. The semiconductor device of claim 19, wherein the conductive material include Cu.

* * * * *